(12) United States Patent
Atarashi et al.

(10) Patent No.: US 8,100,561 B2
(45) Date of Patent: Jan. 24, 2012

(54) LIGHT SOURCE UNIT

(75) Inventors: Yuichi Atarashi, Hachioji (JP); Fumio Nagai, Hachioji (JP)

(73) Assignee: Konica Minolta Opto, Inc., Tokyo (JP)

( * ) Notice: Subject to any disclaimer, the term of this patent is extended or adjusted under 35 U.S.C. 154(b) by 143 days.

(21) Appl. No.: 12/593,138

(22) PCT Filed: Feb. 28, 2008

(86) PCT No.: PCT/JP2008/053506
§ 371 (c)(1),
(2), (4) Date: Sep. 25, 2009

(87) PCT Pub. No.: WO2008/126495
PCT Pub. Date: Oct. 23, 2008

(65) Prior Publication Data
US 2011/0002123 A1    Jan. 6, 2011

(30) Foreign Application Priority Data
Mar. 30, 2007   (JP) .................... 2007-092991

(51) Int. Cl.
*F21S 8/00*    (2006.01)
(52) U.S. Cl. ........ 362/277; 362/280; 362/281; 362/322; 362/324; 362/511; 362/268; 362/257; 362/296.05
(58) Field of Classification Search .................. 362/554, 362/560, 277, 257, 268, 280, 281, 296.05, 362/322, 324, 511
See application file for complete search history.

(56) References Cited

U.S. PATENT DOCUMENTS

| | | | |
|---|---|---|---|
| 5,408,094 A * | 4/1995 | Kajimura ..................... | 250/234 |
| 6,067,195 A * | 5/2000 | Hirunuma et al. ............ | 359/557 |
| 6,218,764 B1 * | 4/2001 | Yoshida et al. ............... | 310/317 |
| 6,305,811 B1 * | 10/2001 | Beeson et al. ................ | 362/626 |
| 6,433,942 B1 | 8/2002 | Memezawa et al. | |
| 6,910,810 B2 * | 6/2005 | Mine et al. .................... | 385/89 |
| 7,062,119 B2 * | 6/2006 | Togawa et al. ................ | 385/16 |
| 7,418,022 B2 * | 8/2008 | Govorkov et al. ............. | 372/55 |
| 7,646,546 B1 * | 1/2010 | O'Shaughnessy et al. ... | 359/669 |
| 2002/0126402 A1 | 9/2002 | Memezawa et al. | |
| 2003/0198444 A1 | 10/2003 | Mine et al. | |

FOREIGN PATENT DOCUMENTS

| | | |
|---|---|---|
| JP | 2002-119074 | 4/2002 |
| JP | 2005-215219 | 8/2005 |
| JP | 2005-222049 | 8/2005 |

OTHER PUBLICATIONS

International Search Report from the Japanese Patent Office mailed May 27, 2008, for International Application No. PCT/JP2008/053506, filed Feb. 28, 2008.

* cited by examiner

*Primary Examiner* — Jong-Suk (James) Lee
*Assistant Examiner* — Tsion Tumebo
(74) *Attorney, Agent, or Firm* — Finnegan, Henderson, Farabow, Garrett & Dunner, L.L.P.

(57) ABSTRACT

A light source unit includes a light source element; an optical-waveguide-formed element in which an optical waveguide is formed; a prism for turning back a light flux emitted from the light source and guiding the light flux toward an incident end of the optical waveguide; and a coupling optical system formed on the prism or provided as a separated body from the prism, for coupling the light flux emitted from the light source onto the optical waveguide.

13 Claims, 8 Drawing Sheets

LIGHT SOURCE UNIT

CROSS-REFERENCE TO RELATED APPLICATIONS

This application is a national phase application of International Application No. PCT/JP2008/053506, filed Feb. 28, 2008, and claims the priority of Japanese Application No. 2007-092991, filed Mar. 30, 2007, the contents of both of which are incorporated herein by reference.

TECHNICAL FIELD

The present invention relates to a light source unit that outputs light emitted from a light source element after passing through an optical waveguide.

BACKGROUND ART

Figure 8:
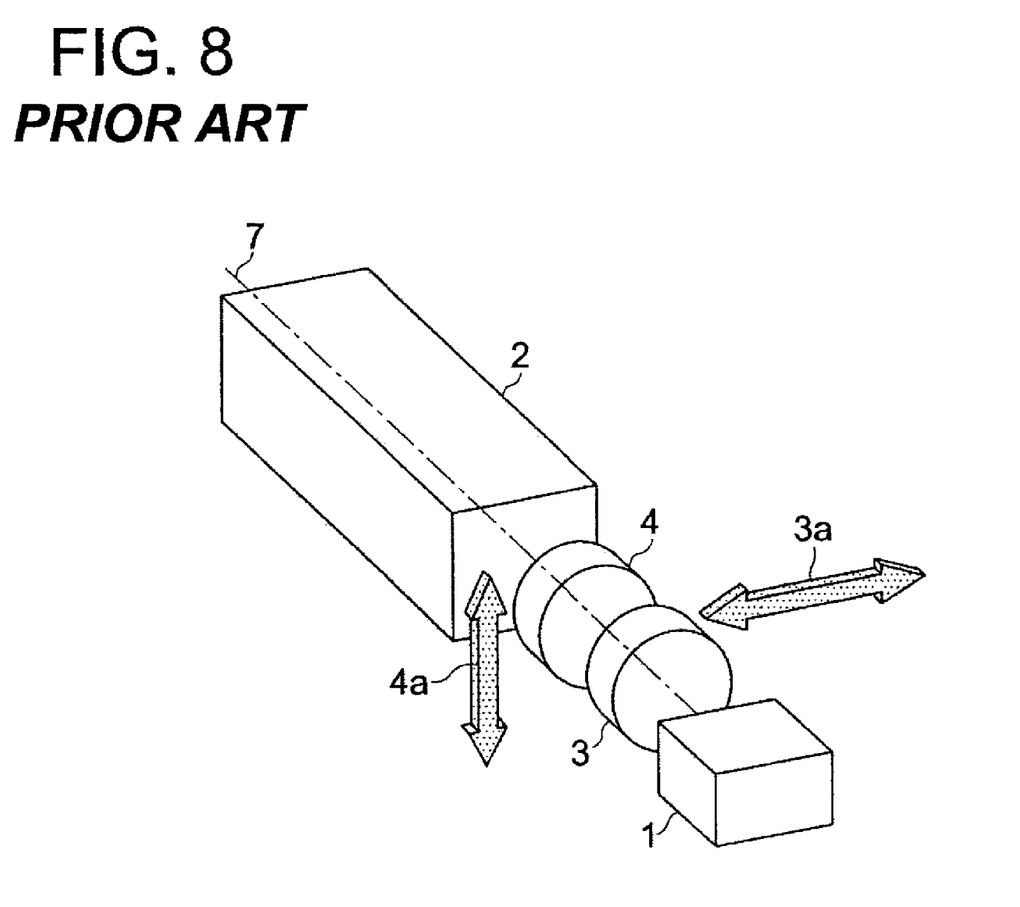
FIG. 8 is a perspective view showing an example of a layout of a light source unit relating to the prior art.

In the example disclosed in Patent Literature 1, a light source unit is made up by arranging semiconductor laser 1, an optical waveguide formed in element 2, and a plurality of lenses 3 and 4 for coupling a light flux emitted from the semiconductor laser 1 to the optical waveguide formed in the element 2, along optical axis 7 representing a straight line, as shown in FIG. 8.

To couple the light flux emitted from the semiconductor laser 1 to the optical waveguide formed in the element 2 successfully, each of the lenses 3 and 4 needs to be capable of being adjusted in terms of positions in directions 3a and 4a which are perpendicular to the optical axis 7. The direction 3a is perpendicular to the direction 4a.

Figure 9:
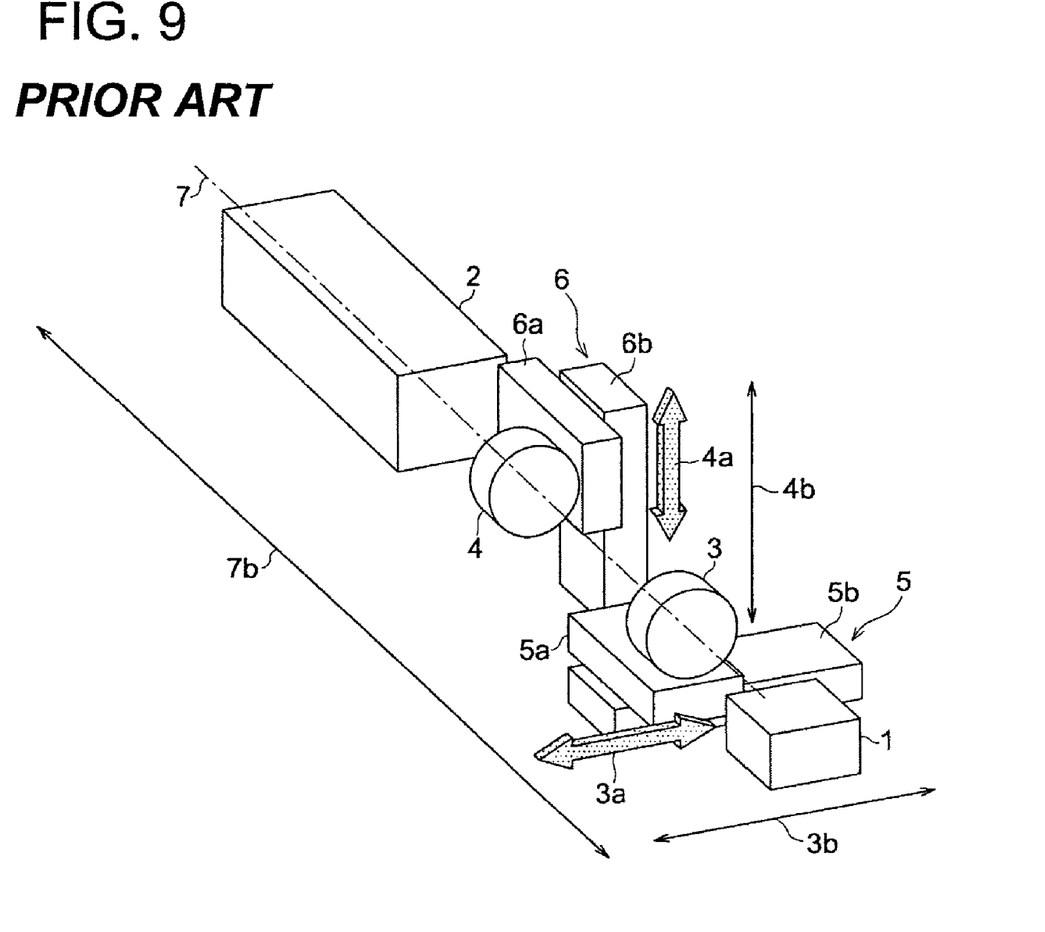
FIG. 9 is a perspective view showing an example of a layout of a light source unit having SIAM unit relating to the prior art.

Therefore, lenses 3 and 4 are mounted on SIDM (Smooth Impact Drive Mechanism) (registered trademark) units 5 and 6 respectively, as shown in FIG. 9. The SIDM unit 5 is composed of movable portion 5a and of fixed portion 5b. In the same way, the SIDM unit 6 is composed of movable portion 6a and of fixed portion 6b. The movable portion 5a moves in direction 3a, and the movable portion 6a moves in direction 4a. Lens 3 is fixed on the movable portion 5a, and lens 4 is fixed on the movable portion 6a.

In a light source unit having the aforesaid construction, dimension 7b in the direction of optical axis 7 is long, because the optical axis 7 is a straight line. Further, dimension 3b in the direction 3a perpendicular to the optical axis 7 grows greater when SIDM unit 5 is added, and dimension 4b in direction 4a which is another perpendicular direction to the optical axis 7 grows greater when SIDM unit 6 is added. Those enlarge the size of a casing in which the light source unit is housed.

The large-sized casing tends to be deformed largely due to temperature and to change relative positional relationship of members housed in the casing, which is not preferable.

When considering the casing to be incorporated in a product as a part, the large-sized casing tends to be avoided.

Patent Literature 1: JP-A No. 2005-222049

DISCLOSURE OF INVENTION

The present invention has been achieved in view of the aforesaid problems in prior art, and the problem to be solved is to shorten a light source unit which outputs a light flux emitted from a light source element after passing through an optical waveguide.

Those problems are solved by the following constructions.
1. A light source unit comprising:
   a light source element;
   an optical-waveguide-formed element in which an optical waveguide is formed;
   a prism for turning back a light flux emitted from the light source and guiding the light flux toward an incident end of the optical waveguide; and
   a coupling optical system formed on the prism or provided as a separated body from the prism, for coupling the light flux emitted from the light source onto the optical waveguide.
2. The light source unit of Item 1,
   wherein the prism comprises a refractive surface forming the coupling optical system.
3. The light source unit of Item 2,
   wherein the light source unit includes a pair of prisms each including the refractive surface forming the coupling optical system.
4. The light source unit of Item 2 or 3,
   wherein the refractive surface is formed on an incident surface or an outgoing surface of the prism.
5. The light source unit of Item 2 or 3,
   wherein the refractive surface is formed on a reflection surface of the prism.

In the construction, "a refractive surface forming the coupling optical system" means a surface having a refractive power by which a light flux emitted by the light source can be coupled to the incident surface of the optical waveguide. When a refractive surface is formed on a reflection surface of a prism, it means that the reflection surface has a refractive power. The reflection surface is capable of not only reflecting the incident light, but also changing a direction of light so as to couple the incident light to the optical waveguide.

6. The light source unit of any one of Items 2 to 5, further comprising:
   an actuator for moving the prism including the refractive surface.

When the light source unit includes plural prisms in the structures of Items 4 to 6, the refractive surface is required to be formed on at least one prism.

7. The light source unit of Item 6,
   wherein the actuator is arranged to extend parallel with an optical axis in a turning section such that a movable direction and an elongated direction of the actuator agree with the optical axis in the turning section, where the optical axis in the turning section connects an optical axis straightly extending from the light source element and an optical axis straightly extending toward the optical-waveguide-formed element.
8. The light source unit of Item 6,
   wherein a movable direction of the actuator is perpendicular to both of an optical axis in a turning section and an optical axis straightly extending toward the optical-waveguide-formed element, where the optical axis in the turning section connects an optical axis straightly extending from the light source element and the optical axis straightly extending toward the optical-waveguide-formed element.

The light source unit of Item 3, further comprising a first actuator and a second actuator for moving the pair of prisms respectively,
   wherein the first actuator is arranged to extend parallel with an optical axis in a turning section such that a movable direction and an elongated direction of the first actuator agree with the optical axis in the turning section, where the optical axis in the turning section connects an optical axis straightly extending from the light source element and an optical axis straightly extending toward the optical-waveguide-formed element, and
   a movable direction of the second actuator is perpendicular to the optical axis in the turning section and to a movable direction of the first actuator.

10. The light source unit of Item 9,
wherein a part of the prism to be moved by the second actuator and a part of the first actuator are arranged to be superimposed on each other.

11. The light source unit of any one of Items 6 to 10, wherein
the refractive surface is formed on an incident surface or an outgoing surface of the prism, and
the actuator comprises a movable portion jointed to a reflection surface formed into a flat surface in the prism.

12. The light source unit of any one of Items 6 to 10,
wherein the refractive surface is formed on any one of three surfaces of the prism including a incident surface, an outgoing surface, and a reflection surface, and
the actuator comprises a movable portion jointed to a surface of the prism neighboring to the three surfaces.

13. The light source unit of any one of Items 6 to 12,
wherein the actuator comprises
an electromechanical transducer;
a drive member connected to one end of the electromechanical transducer, the one end facing an expansion and contraction direction of the electromechanical transducer; and
a moving member engaged with the drive member by a friction,
wherein the actuator is an actuator for a linear movement, and causes a relative displacement between the drive member and the moving member by expanding and contracting the electromechanical transducer with different speeds.

14. The light source unit of Item 1,
wherein the coupling optical system is formed from a lens formed as a separated body from the prism.

In the aforesaid constructions, a prism turns back a light flux emitted from the light source element to guide the light flux toward an incident end of an optical waveguide. It does not elongate the light source unit by arranging construction elements along a straight line extending in a propagation direction of the optical waveguide. Therefore, it exhibits an effect to shorten the light source unit by the length of turning back.

Further, by constituting a coupling optical system by forming a refractive surface on the prism, it is possible to constitute a light source unit to be small in size and to be simple without increasing the number of parts.

BRIEF DESCRIPTION OF DRAWINGS

Each of FIGS. 2a and 2b is an optical path diagram for illustrating a principle of an image point adjustment of the coupling optical system.

Each of FIGS. 4a, 4b and 4c is an optical path diagram for illustrating a principle of an image point adjustment of the coupling optical system.

BEST MODE FOR CARRYING OUT THE INVENTION

Embodiments of the present invention will be explained as follows, referring to the drawings. The followings represent embodiments of the invention, and do not limit the invention.

First Embodiment

Figure 1:
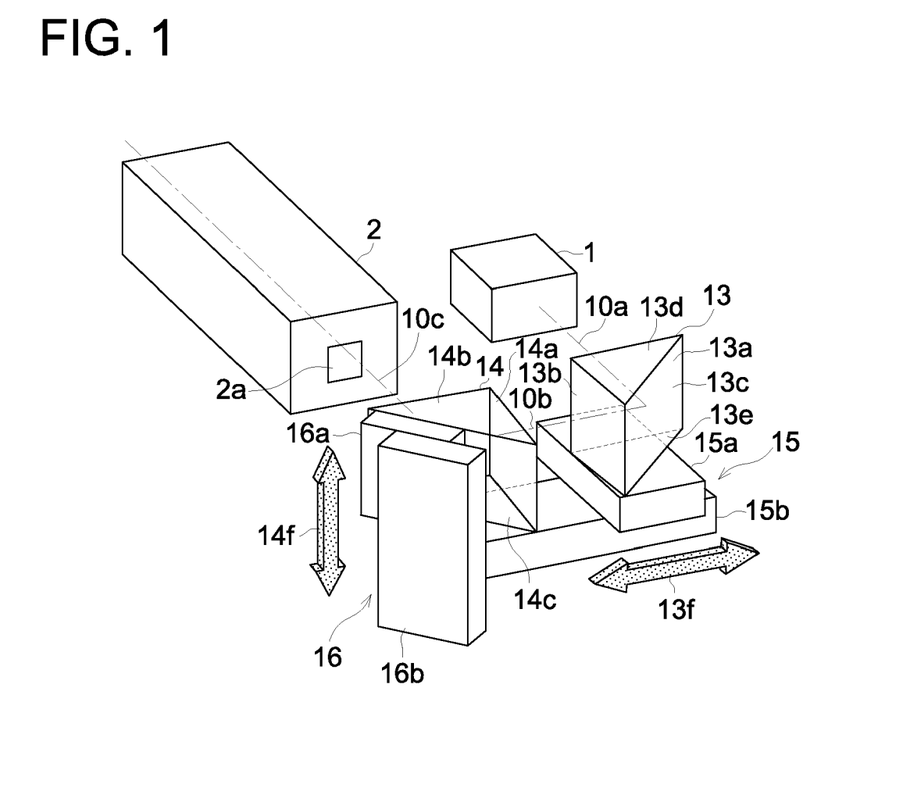
FIG. 1 is a perspective view showing a layout of a light source unit relating to the first embodiment of the present invention.

First, the first embodiment of the invention will be explained, referring to FIG. 1. FIG. 1 is a perspective view showing a layout of a light source unit relating to the first embodiment of the present invention.

A light source unit in the present embodiment is arranged as shown in FIG. 1. There is provided light source element 1 to which a semiconductor laser is applied, and an optical-waveguide-formed element 2 in which the optical waveguide is formed. A typical example of the optical-waveguide-formed element 2 includes SHG element that generates a secondary harmonic wave in an optical waveguide, and an optical fiber.

Optical axis 10a that extends straight from light source element 1 is in parallel substantially with optical axis 10c that extends straight toward optical-waveguide-formed element 2. The light source element 1 and the optical axis 10a are arranged to be parallel with the optical-waveguide-formed element 2 and the optical axis 10c. A space between the optical axis 10a and the optical axis 10c is connected with optical axis 10c as a turning section. Those form an optical path which is turned back with two bending points.

A light flux emitted from the light source element 1 is bent first by the first prism 13. The light flux emitted from the light source element 1 enters incidence surface 13a of the first prism 13, then is reflected on reflection surface 13c of the first prism 13 by about 90° to be bent, and further travels in the direction of optical axis 10b to emerge from outgoing surface 13b.

On one of three surfaces including incident surface 13a, outgoing surface 13b, and reflection surface 13c, there is formed a refractive surface which converts a light flux emitted from light source element 1 into a parallel light flux.

The parallel light flux emerging from the first prism 13 enters incident surface 14a of the second prism 14, then is reflected on reflection surface 14c of the second prism 14 by about 90° to be bent, and further travels in the direction of optical axis 10c to emerge from an outgoing surface 14b. On the incident surface 14a or the outgoing surface 14b, there is formed a refractive surface which converges the parallel light flux emerging from the first prism 13 to incident edge 2a. The reflection surface 14c is formed to be a flat surface.

When forming a refractive surface on the incident surface and the outgoing surface, a light flux can be coupled with an optical waveguide sufficiently, by forming it to be a curved surface on a rotational symmetry basis. When flatness of an outgoing mode field and an incident mode field of the semiconductor laser and the optical waveguide is great, it is possible to enhance a coupling efficiency by creating the curved surface on a rotational asymmetry basis. When forming a refractive surface on the reflection surface, the surface is basically a curved surface on a rotational asymmetry basis.

Further, in the first prism 13 and the second prism 14, there is a fear that a light flux entering each prism is partially reflected on its incident surface to return in the optical axis direction. For preventing this, it is possible to arrange the prisms to be tilted so that an incident light may have a prescribed incident angle to the incident surface of the prism. Owing to this, a coupling efficiency can be further enhanced.

As stated above, a light flux emitted from light source element 1 is turned back by the first prism 13 and the second prism 14 to be guided toward incident edge 2a of the optical waveguide.

Further, a refractive surface formed on the first prism 13 and a refractive surface formed on the second prism 14 form a coupling optical system that corresponds to lenses 3 and 4 in the aforesaid prior art.

Further, the present light source unit is equipped with SIDM units (linear movement actuators) 15 and 16 as those corresponding to SIDM units 5 and 6 in the aforesaid prior art.

The SIDM unit is used for small-sized equipment because of its high accuracy, high responsibility, and quiet operation, and it is disclosed in JP-A No. 2002-119074. The SIDM unit is a drive unit employing an electric converting element such as a pressure-electric converting element (piezoelectric element) that expands and contracts depending on impression of voltage, and those shown in FIG. 10 and FIG. 11, for example, are commonly known.

Figure 10:
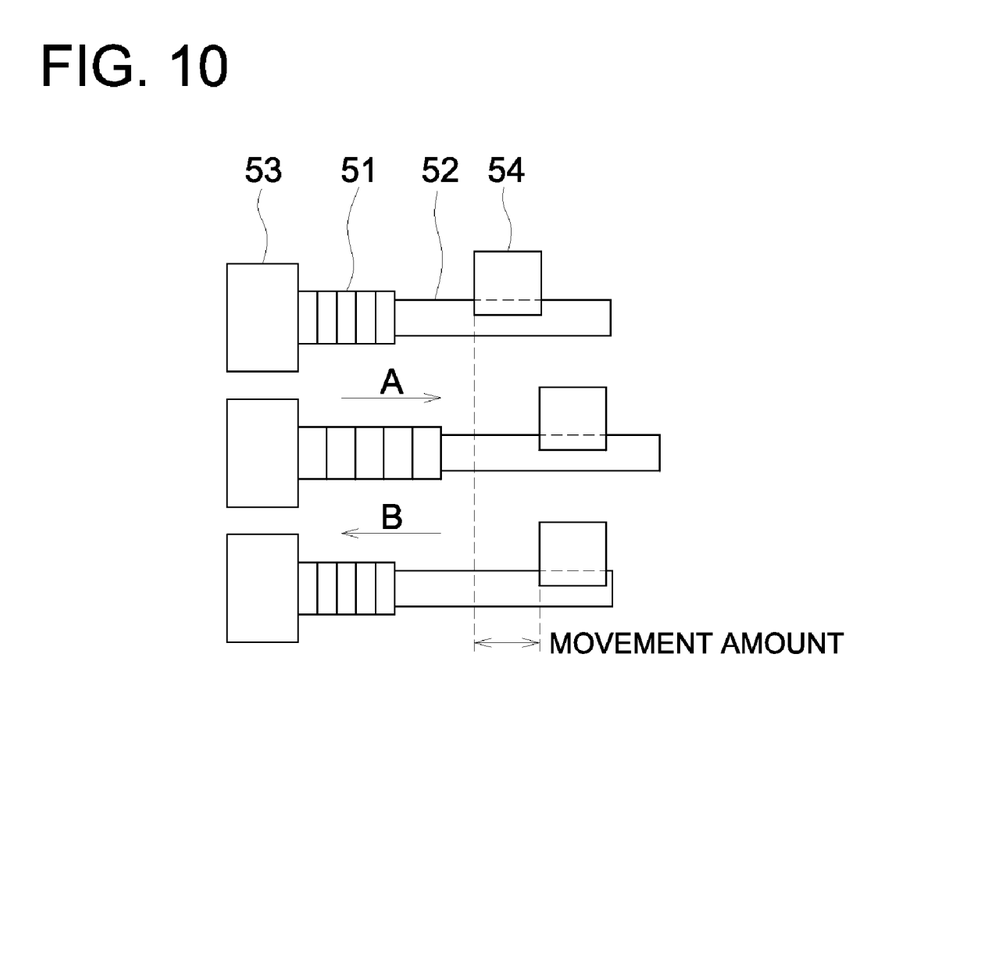
FIG. 10 is an illustration diagram that illustrates SIAM unit relating to the present invention.

As shown in FIG. 10, the SIAM unit is composed mainly of electric converting element 51, drive member 52, fixed member 53 and moving member 54.

The electric converting element 51 is a piezoelectric element wherein many piezoelectric plates are laminated, and it expands and contracts when voltage is impressed thereto.

The drive member 52 is a rod-shaped member that is combined with one end facing the direction of expansion and contraction of the electric converting element 51, and it is made of a hard material that has an excellent sliding property.

The fixed member 53 holds the other end of the electric converting element 51 facing the direction of its expansion and contraction, on a cantilever basis. The fixed member 53 is made of metallic material with considerable mass.

The moving member 54 is a member that moves an optional member that needs to be moved by connecting with the optional member, and it engages with the drive member 52 under prescribed frictional force. Though the moving member 54 is shown in FIG. 10 in a simplified way, the drive member 52 is interposed between V-shaped groove provided on the moving member 54 and a leaf spring, for example. Thereby, the moving member 54 is engaged frictionally with the circumference of the drive member 52.

Owing to this, it is possible to move the moving member 54 relatively to the fixed member 53, and it is possible to use as a prism drive device in the light source unit, for example, as will be stated later. Namely, when the moving member 54 is connected with a prism, it is possible to move the prism together with the moving member 54.

Figure 11:
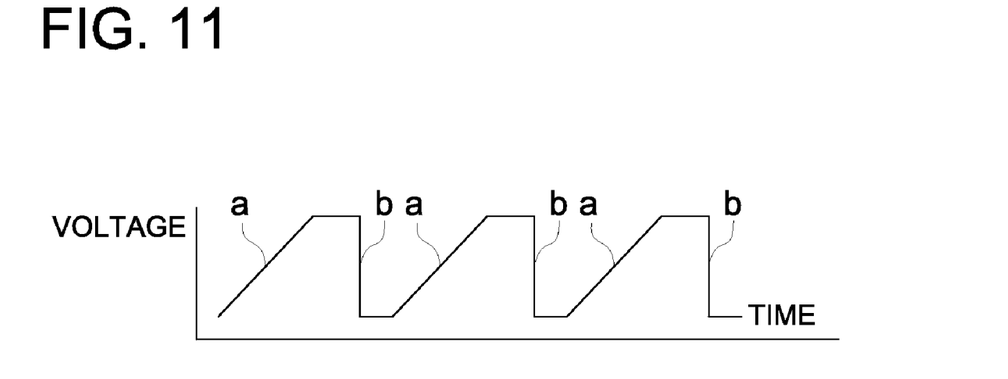
FIG. 11 is an illustration diagram that illustrates SIDM unit relating to the present invention.

An unillustrated voltage control circuit (drive circuit) is connected to the electric converting element 51. When pulse voltage expressed by a saw-tooth wave form shown in FIG. 11 is impressed to the electric converting element 51 continuously, the electric converting element 51 vibrates to expand and contract and the drive member 52 also vibrates in its elongated direction. Specifically, the electric converting element 51 expands relatively slowly by responding to a gently rising slope of the pulse voltage, and the electric converting element 51 contracts quickly to return to the initial length corresponding to down slope b.

When voltage is impressed so that the aforesaid pulses may be repeated continuously, the drive member 52 vibrates by repeating a slow movement in the direction A shown in FIG. 10 and a prompt movement in the direction B shown in FIG. 10. In this case, a frictional binding power of the moving member 54 for the drive member 52 is regulated so that the moving member 54 may move together with the drive member 52 when the drive member 52 moves slowly, and the moving member 54 may stay at its position by inertia (or the moving member 54 may move by an amount smaller than that of the drive member 52) when the drive member 52 moves promptly. Therefore, the moving member 54 moves in the direction of A relatively to fixed member 53 while the drive member 52 is vibrating.

Incidentally, when the moving member 54 is moved in the direction of arrow B in FIG. 10, a pulse shape of voltage to be impressed on the electric converting element 51 may be changed such that a promptly rise slope and a gently down slope are provided instead of that shown in FIG. 11. A principle of movement of the moving member 54 is the same as that in the aforesaid occasion.

Further, vibrations of the electric converting element 51 are transmitted not only to the drive member 52 but also to the fixed member 53, resulting in a loss in expanding and contracting vibrations of the drive member 52. For decreasing this loss, a material having smaller elastic deformation and greater mass is used for the fixed member 53, and the fixed member 53 is caused to function as a weight. For example, the fixed member 53 is made of a metallic material such as tungsten or stainless steel having higher Young's modulus and higher specific gravity.

In FIG. 1, SIDM unit 15 is simplified to be shown, an explanation will be given under the condition that SIDM unit 15 is composed of movable portion 15a and of fixed portion 15b. In the explanation, SIDM unit 16 is composed of movable portion 16a and of fixed portion 16b, in the same way. The movable portions 15a and 16a correspond to moving member 54 in FIG. 10, and the fixed portions 15b and 16b correspond to fixed member 53 in FIG. 10. Movable portion 15a moves in direction 13f, and movable portion 16a moves in direction 14f. First prism 13 is fixed on the movable portion 15a, and second prism 14 is fixed on the movable portion 16a. The direction 13f is perpendicular to optical axis 10a, and it is in parallel with optical axis 10b. The direction 14f is perpendicular to optical axes 10b and 10c. The direction 13f and the direction 14f are perpendicular to each other.

The movable portion 15a is connected to edge surface 13e that is one of two edge surfaces 13d and 13e which neighbor to the aforesaid three surfaces 13a, 13b and 13c of the first prism 13. It avoids an optical functional surface, which reduces difficulty in the case of the connection.

The movable portion 16a is connected to reflection surface 14c of the second prism 14. It means a connecting operation on a flat surface, therefore, difficulty is less, compared with a connecting operation on a refractive surface.

Fixed portion 15b of SIDM unit 15 is arranged to extend parallel with optical axis 10b with its elongated direction being agree with the optical axis 10b. Therefore, most part of the SIDM unit 15 can be placed within an area along the length of optical axis 10b. It improves space efficiency and downsizes the whole apparatus.

Further, the SIDM unit 16 is arranged so that a part of the second prism 14 and a part of fixed portion 15b of the SIDM unit 15 are overlapped each other when the SIDM unit 16 is viewed in its movable direction 14f. Namely, a part of the second prism 14 is arranged on the fixed portion 15b to be overlapped with each other. Due to this, space saving can further be attained, and the whole apparatus can be downsized.

Next, a principle of adjustment of an image point of a coupling optical system will be explained.

Figure 2A:
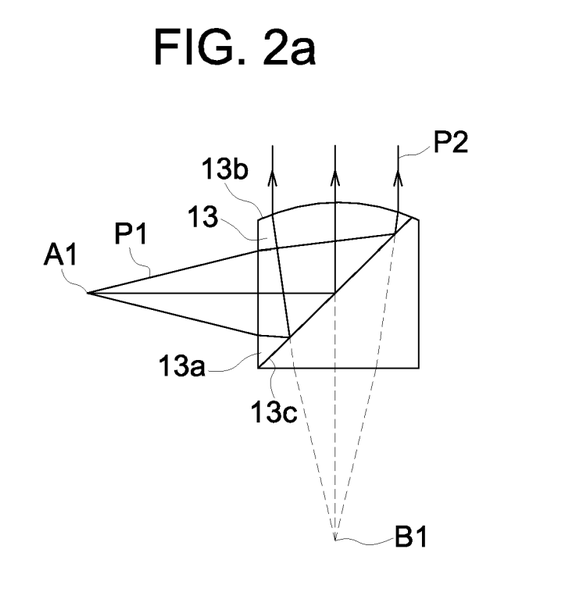
Figure 2B:
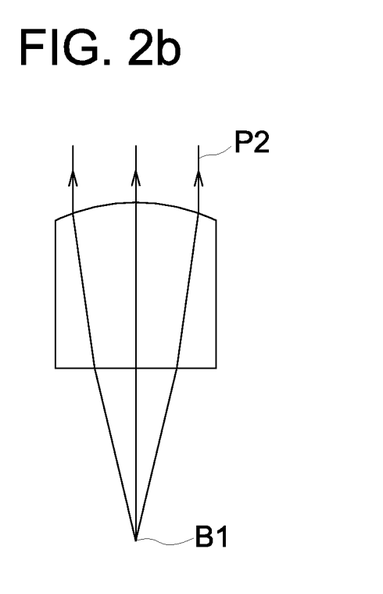

First, there is considered optical paths of light P1 which enters incident surface 13a of the first prism 13 from point light source A1, then, is reflected on a reflection surface 13c of the first prism 13, and emerges from outgoing surface 13b formed into a refractive surface, as shown in FIG. 2a. These optical paths are equivalent to broken lines in FIG. 2a and the optical paths from point light source B1 shown in FIG. 2b, under the condition that the reflection surface 13c is excluded.

Figure 3:
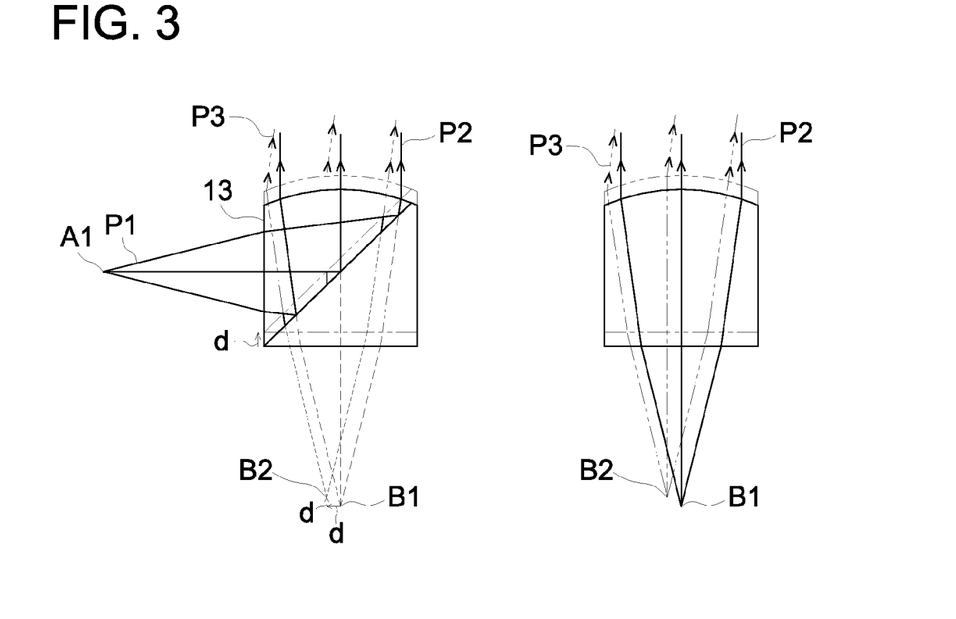
FIG. 3 is an optical path diagram for illustrating a principle of an image point adjustment of the coupling optical system.

As shown in FIG. 3, if the prism is shifted upward by minute amount d, light P1 emerges from the prism as parallel light P3 as shown with two-dot chain lines. This is equivalent to the movement of point light source B1 to point B2 where the point source of light B1 is moved by an amount d longitudinally and laterally, as shown with broken lines in FIG. 3, in the optical system from which a reflection surface is excluded.

Figures 4A, 4B:
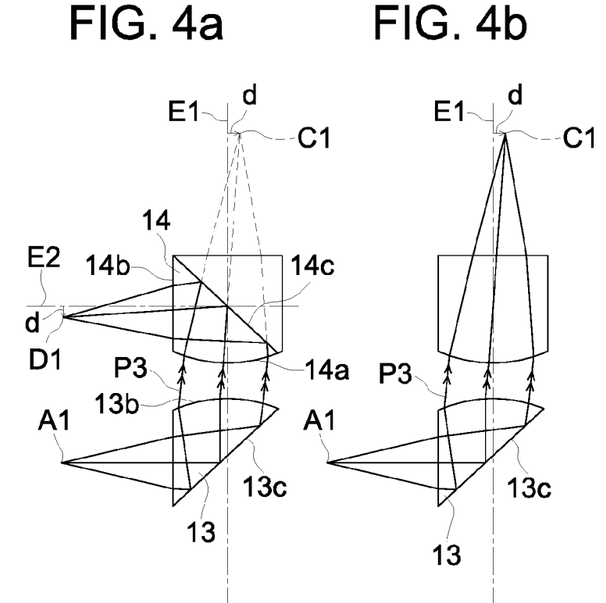
Figure 4C:
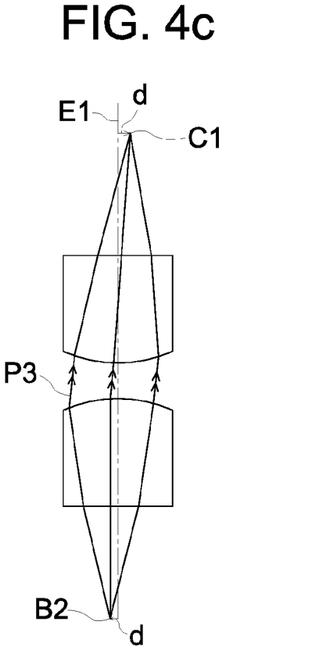

Next, there is considered an occasion wherein the parallel light P3 enters the second prism 14 that is arranged on the same axis as that for the first prism 13, as shown in FIG. 4a. In the optical system excluding reflection surface 14c, focal point C1 is shifted from neutral axis E1 to the right side by an amount d. Therefore, focal point D1 after the reflection on reflection surface 14c is shifted downward from neutral axis E2 by an amount of d. Incidentally, FIG. 4a is equivalent to FIG. 4b if reflection surface 14c is excluded, and is equivalent to FIG. 4c if reflection surfaces 13c and 14c are excluded.

In the case of the example explained above, if the first prism 13 is shifted toward the second prism 14, a focal point after passing through the second prism 14 is shifted toward the first prism 13 side. Relationships between movement directions of the first prism 13 and the second prism 14 and movement directions of the focal points are described collectively in FIG. 5 and Table 1.

Figure 5:
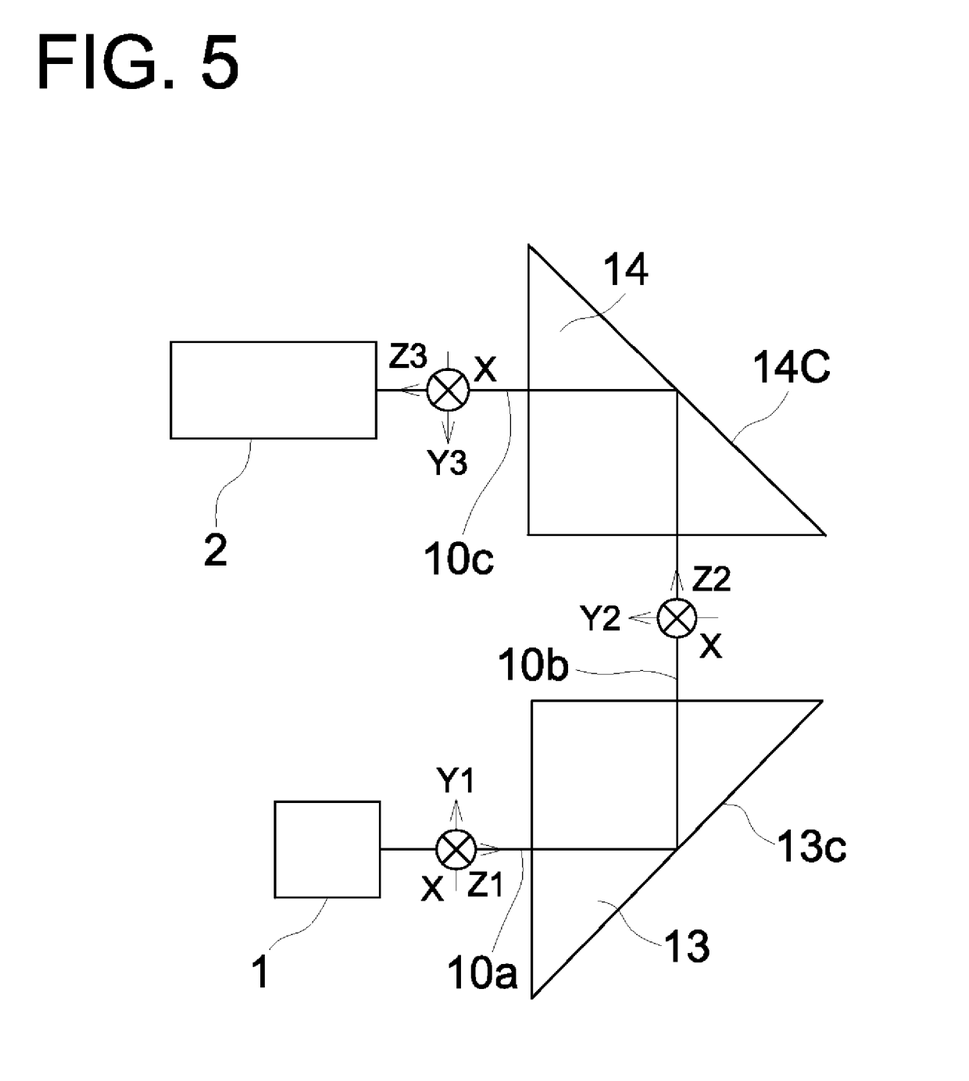
FIG. 5 is a diagram showing a definition of coordinate systems for explaining a relationship between moving directions of the first prism 13 and the second prism 14, and a moving direction of a focal point.

As shown in FIG. 5, Z1 axis, Z2 axis and Z3 axis are defined to extend along optical axes respectively, then, X axes are defined to extend perpendicular respectively to the drawing sheet. Further, there are defined Y1 axis that is perpendicular to X-Z1 plane, Y2 axis that is perpendicular to X-Z2 plane, and Y3 axis that is perpendicular to X-Z3 plane.

Relations between movement directions of the first prism 13 and the second prism 14 and movement directions of focal points are put in order in Table 1 by the X-Y1-Z1 coordinate systems, the X-Y2-Z2 coordinate systems and the X-Y3-Z3 coordinate systems which are defined as stated above.

TABLE 1

| Moving direction of first prism 13 | Moving direction of focal point |
|---|---|
| +Y1 | +Y3 |
| +X | −X |
| +Z1 | −Z3 |
| Moving direction of second prism 14 | |
| +Z2 | −Y3 |
| +Y2 | +Z3 |
| +X | +X |

Namely, as shown in Table 1, when the first prism 13 is moved in the positive direction of Y1 axis, the focal point moves in the positive direction of Y3 axis. When the first prism 13 is moved in the positive direction of X axis, the focal point moves in the negative direction of X axis. When the first prism 13 is moved in the positive direction of Z1 axis, the focal point moves in the negative direction of Z3 axis. Further, when the second prism 14 is moved in the positive direction of Z2 axis, the focal point moves in the negative direction of Y3 axis. When the second prism 14 is moved in the positive direction of Y2 axis, the focal point moves in the positive direction of Z3 axis. When the second prism 14 is moved in the positive direction of X axis, the focal point moves in the positive direction of X axis.

Second Embodiment

Figure 6:
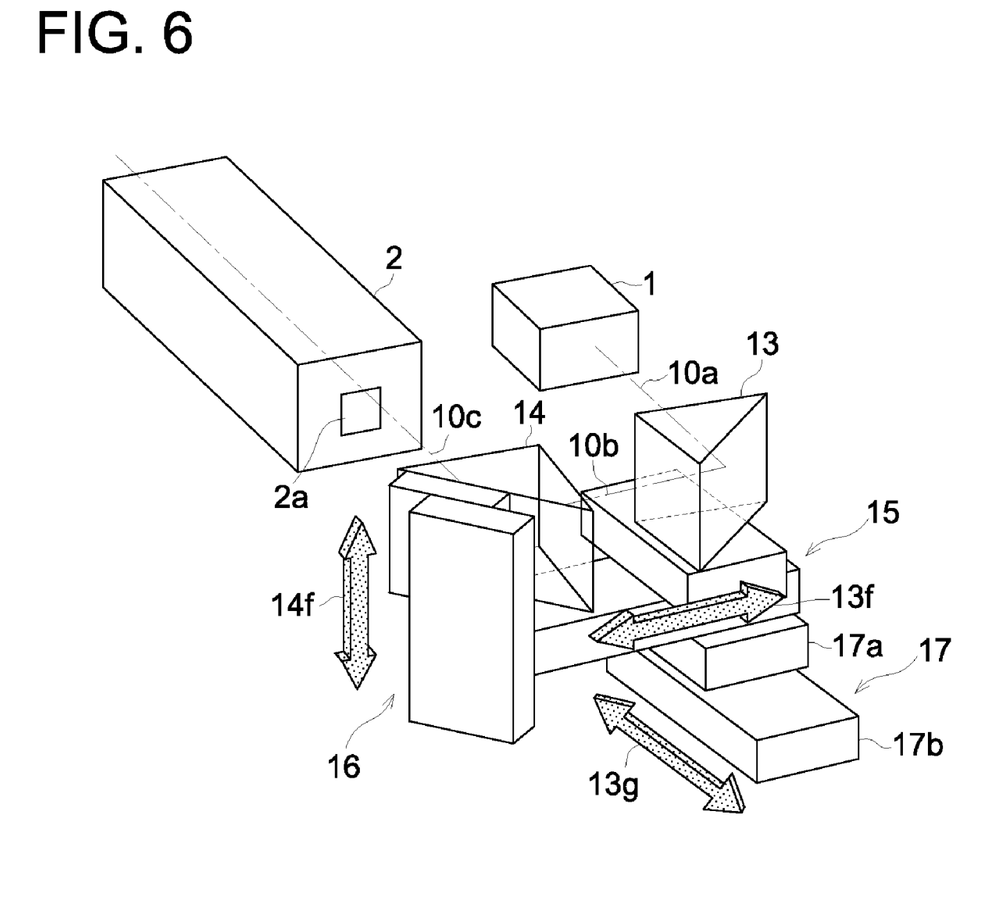
FIG. 6 is a perspective view showing a layout of a light source unit relating to the second embodiment of the present invention.

Next, the second embodiment of the invention will be explained as follows, referring to FIG. 6. FIG. 6 is a perspective view showing a layout of a light source unit relating to the second embodiment of the invention. The present embodiment is the same as the first embodiment except that SIDM unit (linear movement actuators) 17 is added.

The SIDM unit 17 is composed of movable portion 17a and of fixed portion 17b. The movable portion 17a moves in direction 13g. The direction 13g is a direction that lies along optical axis 10a. The SIDM unit 15 is mounted on the movable portion 17a to be fixed.

Due to the aforesaid configuration, the first prism 13 can be moved along the direction of optical axis 10a of light that enters the first prism 13. Owing to this, a size of a converged spot on incident edge 2a can be corrected, and whereby, temperature of optical-waveguide-formed element 2 can be corrected.

Third Embodiment

Figure 7:
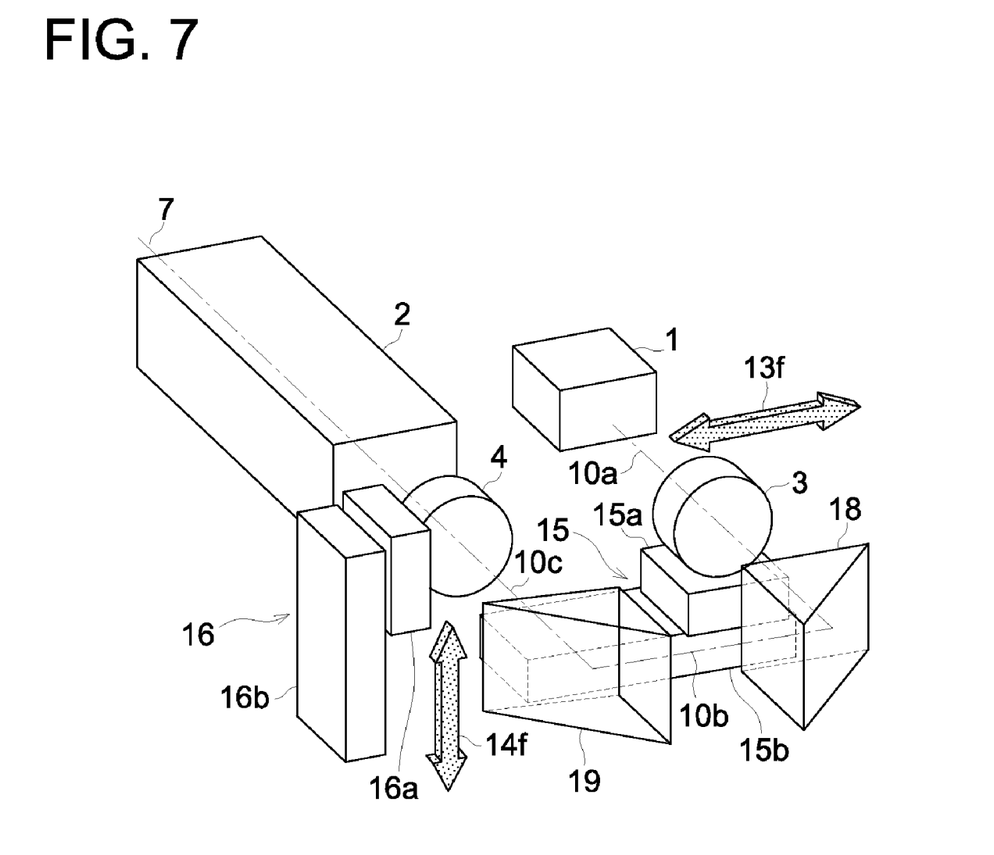
FIG. 7 is a perspective view showing a layout of a light source unit relating to the third embodiment of the present invention.

Next, the third embodiment of the invention will be explained as follows, referring to FIG. 7. FIG. 7 is a perspective view showing a layout of a light source unit relating to the third embodiment of the invention. The present embodiment is the same as the first embodiment except that lenses are mounted on SIDM unit 15 and prisms are fixed.

On the movable portion 15a of the SIDM unit 15, there is fixed lens 3 that is the same as a conventional one. The lens 3 is arranged on optical axis 10a, and it can be moved by SIDM unit 15 along the direction 13f.

On the movable portion 16a of the SIDM unit 16, there is fixed lens 4 that is the same as a conventional one. The lens 4 is arranged on optical axis 10a, and it can be moved by SIDM unit 16 along the direction 14f.

Prisms 18 and 19 are fixed at predetermined positions compared to the position of light source element 1. A light flux emitted from the light source element 1 is first bent by prism 18, and then, is further bent by prism 19 to be turned back, and is guided toward incidence edge 2a of the optical waveguide.

On the other hand, the light flux emitted from the light source element 1 is converted by lens 3 into a parallel light flux and is converged by lens 4 on incident edge 2a of the optical waveguide.

As stated above, a coupling optical system is constituted by lens 3 and lens 4 which are individual elements separated from prism 18 and prism 19. By moving lens 3 and lens 4 in directions 13f and 14f respectively with SIDM units 15 and 16, a position of a focal point on incident edge 2a can be adjusted.

It is also effective to achieve further downsizing, by arranging lens 4 in a space between prism 18 and prism 19 together with SIDM unit 16. When no element is arranged between the prisms, the two prisms 18 and 19 may be replaced by a single the prism. However, in this case, growing in size and inconvenience of arrangement are feared. Thus, the aforesaid embodiment employing two separated prisms is preferable.

EXAMPLES

Two examples which can be applied to the aforesaid First Embodiment or to the Second Embodiment will be disclosed as follows. Example 1 is shown in Table 2. Example 2 is shown in Table 3.

TABLE 2

(a) Paraxial data

| Surface No. | Curvature radius | Thickness | Material | Remarks |
|---|---|---|---|---|
| 1 | ∞ | 0.305 | | Light source |
| 2 | ∞ | 0.900 | bk7 | First prism Surface S1 |
| 3 | ∞ | 0.900 | bk7 | Turning surface (surface tilt −45 deg.) |
| 4 | −0.76003 | 0.000 | | First prism Surface S2 |
| 5 | ∞ | 0.500 | | |
| 6 | 0.76003 | 0.900 | bk7 | Second prism Surface S1 |
| 7 | ∞ | 0.900 | bk7 | Turning surface (surface tilt −45 deg.) |
| 8 | ∞ | 0.305 | | Second prism Surface S2 |
| 9 | ∞ | 0.000 | | Waveguide |

(b) Aspheric surface coefficient

| Surface No. | Fourth surface | Sixth surface |
|---|---|---|
| K | −9.89633E−01 | −9.89633E−01 |
| A4 | −1.47175E−01 | 1.47175E−01 |
| A6 | −7.22182E−02 | 7.22182E−02 |
| A8 | −1.30250E−02 | 1.30250E−02 |
| A10 | −5.26440E−02 | 5.26440E−02 |

(c) Focal length [mm]

| First prism | 1.50 |
|---|---|
| Second prism | 1.50 |

(d) Wavelength [μm]

1.06

(e) Mode field radius [μm]

| | X | Y |
|---|---|---|
| Light source | 1.5 | 1.5 |
| Waveguide | 1.5 | 1.5 |

TABLE 3

(a) Paraxial data

| Surface No. | Curvature radius | Thickness | Material | Remarks |
|---|---|---|---|---|
| 1 | ∞ | 0.638 | | Light source |
| 2 | 2.1852 | 0.700 | BAL35 | First prism Surface S1 |
| 3 | ∞ | 0.700 | BAL35 | Turning surface (surface tilt −45 deg.) |
| 4 | −0.95551 | 0.000 | | First prism Surface S2 |
| 5 | ∞ | 0.500 | | |
| 6 | 0.95551 | 0.700 | BAL35 | Second prism Surface S1 |
| 7 | ∞ | 0.700 | BAL35 | Turning surface (surface tilt −45 deg.) |
| 8 | −2.1852 | 0.638 | | Second prism Surface S2 |
| 9 | ∞ | 0.000 | | Waveguide |

(b) Aspheric surface coefficient

| Surface No. | Second surface | Fourth surface | Sixth surface | Eighth surface |
|---|---|---|---|---|
| K | −3.04953E+01 | −1.05204E+00 | −1.05204E+00 | −3.04953E+01 |
| A4 | −4.10190E−02 | −6.91635E−02 | 6.91635E−02 | 4.10190E−02 |
| A6 | 1.98607E−02 | −6.72005E−03 | 6.72005E−03 | −1.98607E−02 |
| A8 | 0.00000E+00 | 0.00000E+00 | 0.00000E+00 | 0.00000E+00 |
| A10 | 0.00000E+00 | 0.00000E+00 | 0.00000E+00 | 0.00000E+00 |

(c) Focal length [mm]

| First prism | 1.38 |
|---|---|
| Second prism | 1.38 |

(d) Wavelength [μm]

1.06

(e) Mode field radius [μm]

| | X | Y |
|---|---|---|
| Light source | 3.0 | 2.0 |
| Waveguide | 3.0 | 2.0 |

As shown in columns of 'Surface No.' through 'Remarks' in Table 1(a) and Table 2(a), each optical surface is given a surface number. Meanwhile, in the column of 'Remarks', 'Surface S1', 'Turning surface' and 'Surface S2' correspond respectively to the aforesaid incident surface, the reflection surface and the outgoing surface, in this order. The column of Curvature radius shows a curvature radius of each optical surface, and the column of Thickness shows a thickness [nm] up to the next numbered surface.

Aspheric surface coefficients are shown in each of Table 2(b) and Table 3(b). A definitional equation is shown in Numeral 1.

$$Z(h) = \frac{h^2/r}{1+\sqrt{1-(1+k)(h/r)^2}} + \sum_{i=2} A_{2i} h^{2i} \quad \text{[Numeral 1]}$$

Focal lengths of the first prism and the second prism are shown in Table 2(c) and Table 3(c), wavelengths of light to be applied are shown in Table 2(d) and Table 3(d), and mode field radiuses are shown in Table 2 (e) and Table 3(e).

Although the refractive surface is provided on surface S2 of the first prism and on surface S1 of the second prism in the Example 1 shown in Table 2, the refractive surface is provided on surface S1 and surface S2 of the first prism and on surface S1 and surface S2 of the second prism, in Example 2 shown in Table 3.

Though the invention has been explained as stated above, by referring to the embodiments, the invention should not be construed to be limited to the aforesaid embodiment, and it is naturally possible to modify and improve properly. For example, in Examples 1 through 3, the light source unit is equipped with two prisms including the first prism and the second prism. However, even in the case of the light source unit including only one of these two prisms, it is also possible to shorten in the direction of the optical axis that extends straight from the light source element or of the optical axis that extends straight toward an optical-waveguide-formed element, resulting in exhibition of the effects of the invention.

The invention claimed is:

1. A light source unit, comprising:
a light source element;
an optical-waveguide-formed element in which an optical waveguide is formed;
a prism for turning back a light flux emitted from the light source and guiding the light flux toward an incident end of the optical waveguide, wherein the light flux forms an optical path along a first optical axis extending from the light source element, a second optical axis extending toward the optical-waveguide-formed element, and a third optical axis connecting the first and second optical axes, the prism comprising a surface with refractive power which forms a coupling optical system for coupling the light flux emitted from the light source onto the optical waveguide; and
an actuator for moving the prism comprising the surface with the refractive power,
wherein the actuator has an elongated shape and is arranged such that an elongated direction of the actuator and a direction where the actuator moves the prism coincide with the third optical axis.

2. The light source unit of claim 1,
wherein the light source unit includes a pair of prisms each including a surface with refractive power forming the coupling optical system.

3. The light source unit of claim 1,
wherein an incident surface or an outgoing surface of the prism has refractive power.

4. The light source unit of claim 1
wherein a reflection surface of the prism has refractive power.

5. The light source unit of claim 1,
wherein a direction where the actuator moves the prism comprising the surface with the refractive power is perpendicular to both of the third optical axis and the second optical axis.

6. The light source unit of claim 2, further comprising:
a first actuator and a second actuator for moving the pair of prisms respectively,
wherein the first actuator has an elongated shape and is arranged such that an elongated direction of the first actuator and a first direction where the first actuator moves one of the pair of prisms agree with the third optical axis, and
a second direction where the second actuator moves the other of the pair of prisms is perpendicular to the third optical axis and to the first direction.

7. The light source unit of claim 6,
wherein the other of the pair of prisms to be moved by the second actuator and a part of the first actuator are arranged to be overlapped with each other when viewed in the second direction.

8. The light source unit of claim 1,
wherein an incident surface or an outgoing surface of the prism has refractive power, and
the actuator comprises a movable portion jointed to a reflection surface formed into a flat surface in the prism.

9. The light source unit of claim 1,
wherein any one of three surfaces of the prism including a incident surface, an outgoing surface, and a reflection surface has refractive power, and
the actuator comprises a movable portion jointed to a surface of the prism neighboring to the incident surface, the outgoing surface, and the reflection surface.

10. The light source unit of claim 1,
wherein the actuator comprises
an electromechanical transducer;
a drive member connected to one end of the electromechanical transducer, the one end facing an expansion and contraction direction of the electromechanical transducer; and
a moving member engaged with the drive member by a friction, wherein the actuator is an actuator for a linear movement, and causes a relative displacement between the drive member and the moving member by expanding and contracting the electromechanical transducer with different speeds.

11. The light source unit of claim 6, wherein an incident surface or an outgoing surface of one of the pair of prisms has refractive power, and
one of the first and second actuators to move the one of the pair of prisms comprises a movable portion jointed to a reflection surface formed into a flat surface in the one of the pair of prisms.

12. The light source unit of claim 6,
wherein any one of three surfaces of one of the pair of prisms including a incident surface, an outgoing surface, and a reflection surface has refractive power, and
one of the first and second actuators to move the one of the pair of prisms comprises a movable portion jointed to a surface of the one of the pair of prisms neighboring to the incident surface, the outgoing surface, and the reflection surface.

13. The light source unit of claim 6,
wherein each of the first and second actuators comprises an electromechanical transducer;
a drive member connected to one end of the electromechanical transducer, the one end facing an expansion and contraction direction of the electromechanical transducer; and
a moving member engaged with the drive member by a friction, wherein each of the first and second actuators is an actuator for a linear movement, and causes a relative displacement between the drive member and the moving member by expanding and contracting the electromechanical transducer with different speeds.

* * * * *